US011030356B2

(12) United States Patent
Marshall et al.

(10) Patent No.: US 11,030,356 B2
(45) Date of Patent: Jun. 8, 2021

(54) AUTOMATED SYSTEM FOR DESIGN AND FABRICATION OF ARTIFICIAL ROCKWORK STRUCTURES

(71) Applicant: DISNEY ENTERPRISES, INC., Burbank, CA (US)

(72) Inventors: Andrew Steven Marshall, Windermere, FL (US); Daniel Robert Richardson, Clermont, FL (US); Katrina Anne Wilder, Windermere, FL (US); Douglas Charles Scharfenberg, Kissimmee, FL (US); Shawn Michael Holmes, Winter Garden, FL (US); Hepzibah Chandranand, Orlando, FL (US); Mike S. Welch, Orlando, FL (US); Michael Tschanz, Orlando, FL (US)

(73) Assignee: Disney Enterprises, Inc., Burbank, CA (US)

( * ) Notice: Subject to any disclaimer, the term of this patent is extended or adjusted under 35 U.S.C. 154(b) by 426 days.

(21) Appl. No.: 16/227,370

(22) Filed: Dec. 20, 2018

(65) Prior Publication Data
US 2020/0201948 A1 Jun. 25, 2020

(51) Int. Cl.
*G06T 17/20* (2006.01)
*G06F 30/13* (2020.01)
(52) U.S. Cl.
CPC .............. *G06F 30/13* (2020.01); *G06T 17/20* (2013.01); *G06T 2200/04* (2013.01)
(58) Field of Classification Search
CPC ..... G06F 30/13; G06T 17/20; G06T 2200/04; G06T 2210/56; G06T 17/00; G06Q 50/08;

(Continued)

(56) References Cited

U.S. PATENT DOCUMENTS

2009/0113969 A1† 5/2009 Buckley

FOREIGN PATENT DOCUMENTS

CN 104196537 A * 12/2014
CN 105205866 A * 12/2015
(Continued)

OTHER PUBLICATIONS

Joe Nasvik, Concrete Construction—Decorative Concrete Hand-carved rockwork, 3 pages, Jun. 15, 2003, Concrete Construction/Hanley Wood, United States.†

(Continued)

*Primary Examiner* — Kandasamy Thangavelu
(74) *Attorney, Agent, or Firm* — Snell & Wilmer L.L.P.; Kent A. Lembke

(57) ABSTRACT

A system for automating design of a support frame for artificial rockwork structures. The system includes a processor and memory storing a three dimensional (3D) mesh for an exterior surface of a rockwork structure. The system includes an offset module that is code/instructions or software executed by the processor to process the 3D mesh and generate an offset mesh defining a 3D topology of the exterior surface at an offset distance from the 3D mesh. The system also includes a chip-defining module including software executed by the processor to divide the offset mesh into a plurality of subsections. The system further includes a rebar line-defining module with software executed by the processor to generate an assembly of rebar pieces for each of the subsections that defines for each of the rebar pieces a length, a location within the subsection, and a set of spaced apart bends.

20 Claims, 7 Drawing Sheets

(58) Field of Classification Search
CPC ....... E02D 17/20; E21D 20/021; E21D 11/02; G01V 99/005
See application file for complete search history.

(56) References Cited

FOREIGN PATENT DOCUMENTS

| | | | | | |
|---|---|---|---|---|---|
| CN | 106089258 | A | * | 11/2016 | ........... E21D 11/102 |
| CN | 107633123 | A | * | 1/2018 | |
| CN | 108442391 | A | * | 8/2018 | ............. E02D 17/20 |

OTHER PUBLICATIONS

C. Gavrell & L. Reutersward, An Automated Process for Concrete Reinforcement Layout Design, 92 pages, Jun. 25, 2018, DiVA, Sweden & Internet.†

* cited by examiner
† cited by third party

AUTOMATED SYSTEM FOR DESIGN AND FABRICATION OF ARTIFICIAL ROCKWORK STRUCTURES

BACKGROUND

1. Field of the Description

The present description relates, in general, to design and fabrication of structures that are built upon or supported on an interior frame or cage such as artificial rockwork structures formed by plastering upon a metal rod frame or cage and used for scenery at theme or amusement parks, shopping malls, pedestrian malls, urban parks, or the like. More particularly, the description is directed to a new method and corresponding system for automating the design and fabrication of the underlying support frame that is formed of individually bent metal rods (herein referred interchangeably to as "rebar" to mean any rod or tube of any metal or metal alloy and of any diameter), as well as then completing the rockwork or similar structure by applying plaster and/or other materials to form an outer or encasing layer or shell.

2. Relevant Background

There are numerous uses for artificial structures to create or enhance an indoor or, more commonly, outdoor space to create a desired look and feel. For example, many designers of common spaces for office buildings, residential complexes, and shopping malls will include large rockwork portions. The rockwork portions can be implemented using artificial or manmade structures fabricated with a plaster or other material(s) applied over a metal rod frame or support structure or cage (or a "rebar structure"). In another example, theme and amusement parks often each will include large amounts of rockwork structure to create outdoor or other backdrops and simulated lands. One industry estimate is that one theme park operator constructs over a hundred thousand square feet of rockwork structure each year.

Presently, designing and fabricating rockwork structures is a time consuming and expensive process. The rockwork is custom designed, and a rebar structure needs to be created for construction. In the current design and fabrication pipeline, each rockwork structure starts with the formation of a foam sculpture or a digitally created three dimensional (3D) model. In other cases, an existing rockwork needs to be refurbished, and the pipeline includes scanning the existing rockwork. If the model is a foam model, sculpture, or an existing rockwork to be refurbished, it then is imported into a 3D modeling environment as a digital mesh via a 3D scan. Next, the imported 3D model is "chipped" or split into pieces. A digital rebar structure is then applied to or created for each chip. The digital rebar structure or model is then either bent manually or by a bending machine that is able to read (or take as input) a digitally produced design file (i.e., the digital rebar structure/model).

In both cases, though, there is presently no way to autonomously generate a rebar structure from a sculpture or 3D digital model of a rockwork structure. As a result, the bending profile for each individual piece of rebar or metal rod must be determined manually, which is very laborious and expensive. Hence, there remains a need for a new automated design and fabrication pipeline or method for rockwork and similar artificial structures built upon a metal rod support frame or cage. Preferably, the new pipeline would be configured to significantly reduce cost and labor for the underlying tasks including how to create the rebar structure model. Further, it is desirable that the new pipeline perform at a higher accuracy than typically achieved using manual design techniques.

SUMMARY

With the above issues in mind, the inventors created a structure design and fabrication system that utilizes specially adapted software modules or software applications (e.g., code or programs executed by one or more processors to provide the underlying functionality) to automate much of the process of designing and generating a digital file that defines the support frame/cage or rebar structure used to create rebar-supported structure to build a new structure or to refurbish an existing structure. A rockwork structure is one useful example of such a structure and is often used herein to describe the structure being designed and then fabricated according to the present description.

A part of the solution to automating design and fabrication was to create custom algorithms implemented in the software modules/applications that autonomously generate digital rebar structures or models for any input structure such as a custom designed piece of rockwork for a theme park or other setting that is being built or that already exists and is being refurbished in whole or in part. Then, these digital rebar structures or models (or models of the support frame/cage) are converted into a data file and loaded into a rebar bender (or rod bending machine) for automated creation of the individual pieces of bent rod or rebar for the frame/cage, which can then be assembled in later fabrication steps in a relatively straightforward manner. To this end, along with the data files, the new system includes software modules that generate assembly drawings to show construction workers how the bent rod or rebar output from the bender is pieced together or assembled to make the support frame/cage for the rockwork structure. It is likely that the design and fabrication pipeline or method provided by the new system will make the designing of rockwork much easier and with a high level of accuracy. There is also a large set of variables in the software of the system that can be manipulated to allow users to adjust the amount of detail desired for any structure.

In the past, the design process includes numerous manual steps with no way to provide automation to the overall process. For example, one prior process was to bend the rebar by hand by having the construction workers use calipers and "best guess" how to scale up the rockwork from a foam sculpture into rebar support frames or cages. This method often lost a large amount of accuracy and was very inefficient and relied upon each worker's skill and experience to obtain a good result. In contrast, the inventors' system (and underlying methods) provides an automated process to create support frames or cages, formed of bent rod or rebar, from an input digital mesh design of a desired rockwork structure.

There are a number of advantages to the new design and fabrication system. First, it has the potential to save up to seventy-five percent in total costs of the rebar creation process because the work typically will not have to be outsourced by a facility operator as the process is mostly automated. Since the algorithms of the software modules are completely automated, once a sculpture is converted into a 3D asset or file, it can almost instantly have a rebar structure associated with it by the system. This means that there is no more waiting for contractors to finish their designs, which will save time as well. Another advantage is that the algorithm(s) will save capital by determining if pieces of bent rebar/rod are not needed in a certain section or part of a chip/subsection of the support frame/cage. Also, the algorithms of the system can be tuned to fit the needs of the user. For example, if a structure would benefit from more stability, users can control the parameters/variables that effect the stability. Another parameter/variable that can be tuned is the accuracy (or fidelity) of the rockwork structure to the input data. This will help ensure that the quality of the output is up to the standards set for a given application.

More particularly, a system is provided for automating design of a support frame for artificial rockwork structures. The system includes a processor (or processors) and memory (i.e., any local or remote data storage device) storing a three dimensional (3D) mesh for an exterior surface of a rockwork structure. The system includes an offset module that is code/instructions or software executed by the processor to process the 3D mesh and generate an offset mesh defining a 3D topology of the exterior surface at an offset distance from the 3D mesh. The system also includes a chip-defining module including software executed by the processor to divide the offset mesh into a plurality of subsections. The system further includes a rebar line-defining module with software executed by the processor to generate an assembly of rebar pieces for each of the subsections that defines each of the rebar pieces with a length, a location within the subsection, and a set of spaced apart bends.

In some embodiments, the software of the offset module includes a Marching Cubes algorithm configured to identify and fill holes in the 3D mesh while generating the offset mesh. In such cases, the offset distance is defined based on a user input distance value (e.g., a value in the range of 2 to 6 inches in many applications where plaster is applied onto a support frame or cage). Each of the subsections has a surface area limited by a maximum length and a maximum width that are adjustable based on user input (such as 4 to 7 feet with 6 feet used in one exemplary system). In some useful embodiments, the chip-defining module includes an automated merge function merging adjacent pairs of the subsections into a new subsection when one of the subsections is determined to have a surface area less than a predefined minimum surface area and when the new subsection has outer dimensions smaller than predefined maximum outer dimensions. In the same or other cases, the chip-defining module may support manual merging and/or splitting of the subsections by a system user/operator.

The rebar line-defining module may be configured so that it processes each of the subsections of the offset mesh using at least one of a raw point algorithm, a common point algorithm, and a Ramer-Douglas-Peucker (RDP) algorithm to generate the assembly of the rebar pieces. The rebar line-defining module may process each of the subsections of the offset mesh first using a common point algorithm and second using an RDP algorithm on a subset of segments to insert additional detail. The rebar line-defining module may define for each of the bends a bending angle and spaces adjacent ones of the bends apart by at least a predefined bend spacing of at least two inches.

The system may further include a drawing generator run by the processor to generate assembly drawings mapping locations of the rebar pieces within each of the subsections and defining assembly of the subsections together to form a support frame for the rockwork structure (upon which plaster or other materials may be applied to form an outer layer or shell). Additionally, the system may include a module run by the processor that generates the 3D mesh from a point cloud file for the exterior surface or from a scan of a model (e.g., a foam model) or from a scan of an existing structure that is to be refurbished. Still further, it is often desirable in the system for the rebar line-defining module to include an algorithm processing the assembly of the rebar pieces to identify and delete redundant Z bars based on intersection distances.

DETAILED DESCRIPTION OF THE PREFERRED EMBODIMENTS

Figure 1:
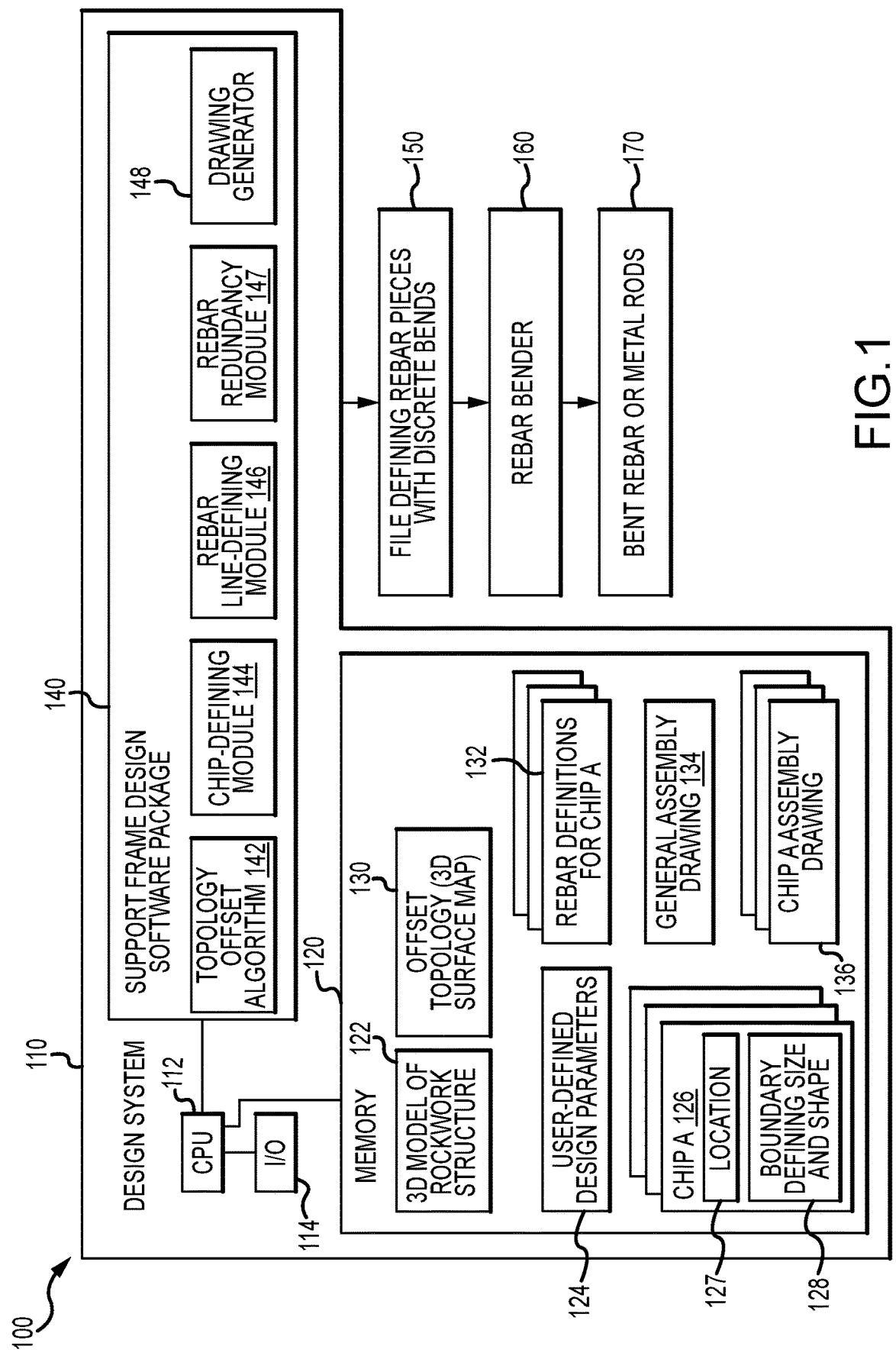
FIG. 1 is a functional block drawing of a rockwork structure design and fabrication system of the present description adapted for automated design of a support frame or cage made up of bent metal rods or rebar pieces and more efficient fabrication of such bent rods or rebar pieces and the corresponding support frame or cage.

Briefly, a new design and fabrication system is described that is adapted to implement software modules with algorithms that automate, simplify, and quicken the process of creating a model of, or a digital file defining, a support frame or cage to be formed of bent pieces of rebar or metal rod. The support frame is fabricated by using a rebar bender that bends each piece of rebar per the created model and by then using an assembly file to allow workers to assemble the pieces of rebar into chips or subsections (e.g., by using welding or other techniques to bind the pieces of rebar together). The chips/subsections are then coupled together to form the final support frame/cage, and a shell or outer layer of plaster or other finishing material(s) is applied over the frame/cage to form the rockwork structure (or other similarly-formed structure).

The following description begins with an overview of the design and fabrication process, and this overview is following by detailed discussion of an exemplary design and fabrication system along with its components and the fabrication process performed with the new system and the pipeline it provides. The first step of the pipeline is to digitally offset the topology of the input model of the desired rockwork structure to where the rebar frame/cage (or its pieces) will be laid during construction of the rockwork structure. The offset or offset depth is typically in the range of 1 to 6 inches, but the topology offset can be varied to suit the particular outer layer/shell (or its materials) used to form the rockwork structure. The topology offset allows for the offset surface to be at the same structure level as the later formed rebar support frame/cage. This step can be performed with many different types of offset methods. One useful method is a custom-developed variation of the Marching Cubes algorithm, which the inventors developed specifically with rockwork structures in mind.

The next step involves identifying the chip locations, including size and shape with a defined outer boundary on the frame/cage outer surface or topography. This step can be done from a 3D-point cloud of the node locations of the attraction/space that will include the new rockwork structure. The chip locations can also be autonomously determined by using user-specified cube sizes and splitting the geometry of the outer surface/topography. Once the chips or subsections have been created, each "chip mesh" is converted into rebar/rod lines, which are autonomously generated.

The lines created on the digital surface are continuous. The inventors recognized that while a rebar bender often can bend a continuous curve it typically will be more advantageous to have discrete bends defined on each piece of rebar or each metal rod. To transition from a continuous line or bend to a discrete bend, custom algorithms (such as the "common-point" algorithm discussed below) were developed and others were leveraged by the inventors, such as the "Ramer-Douglas-Peucker" algorithm. These algorithms assist the system in creating discrete rebar lines to further define a chip or chip model. Other custom algorithms, such as the "Smart-Z" algorithm are leveraged to allow the system to determine if there are rebar pieces/metal rods that are redundant and are, therefore, not needed and can be removed from a chip definition. This helps save on material cost for rebar and for labor of construction for unnecessary rebar.

After all the chips are converted to rebar structures (or are further defined as an assembly of pieces of rebar or metal rods (or rod lengths)), the next step in the process involves autonomously generating assembly drawings on a chip-by-chip basis for the rebar structure or support frame/cage. These assembly drawings define for construction workers how to put together each chip (e.g., where each particular bent piece of rebar belongs and how they are interconnected within the chip (such as by welding or the like at intersections)). Along with the assembly drawings, data files for the rebar bender are generated. These files can be imported into a 2D rebar bending machine.

Once all the rebar chips or subsections are constructed, workers piece the chips/subsections together by referencing a global assembly drawing that defines where each chip is positioned and how it is oriented to form the support frame/cage for the rockwork structure. After the frame is constructed, the process continues with applying one or more layers of plaster over the outer surfaces of the rebar support frame/cage to form the outer layer/shell (i.e., exterior layers) and complete the rockwork structure (with it being understood that additional coatings such as texturing, paints, and the like may be applied to the outer layer/shell to achieve a desired look for the rockwork structure).

FIG. 1 illustrates with a functional block diagram a design and fabrication system 100 specially adapted for performing the above steps or functions of a rockwork structure design and fabrication process. As shown, a design system 110 is includes that may be provided by one or more computing devices working separately or networked together for wired and/or wireless communications. The system 100 includes one or more processors 112 executing code or instructions in local or remote memory/data storage 120 to provide the functions of a support frame design software package 140.

The processor 112 also runs an operating system (not shown) and manages input/output (I/O) devices 114 and storage and retrieval of digital data from memory or data storage 120. The I/O devices 114 may include a keyboard, a mouse, voice recognition software/devices, a touchscreen, a monitor(s), and/or other devices useful for allowing a user of system 110 to view, enter, and manipulate data being processed and generated by the software package 140 including entering and changing the user-defined design parameters 124.

As shown, the memory 120 is used to store a 3D model of a rockwork structure 122 (intended to include any structure with a rebar-based support frame/cage). The 3D model 122 may take a wide variety of forms to practice the system 100 and is generally created from a 3D scan of a foam model of a structure under design or from a 3D digital sculpt, and the 3D model 122 may be configured as a mesh or point cloud defining the 3D exterior surfaces of a target rockwork structure. The rockwork structure 122 is provided as the input data for the design software package 140. The memory 120 also stores a set of user-defined design parameters 124 for use by the software package 140 that allow a user to use default variable/parameter values or to tune performance of the software package 140 by setting all or a subset of these values (such as an offset depth for use by the topology offset algorithm 142).

The design software package 140 includes a topology offset algorithm 142 that digitally offsets the topology of the 3D model of the rockwork structure 122 by an offset value set in the parameters 124 (such as 1 to 6 inches), and offset topology 130 generated by the algorithm 142 and providing a 3D surface map for a rebar support frame/cage is stored in memory 120 by the processor 112. The design software package 140 also includes a chip-defining module 144 that acts to process the offset topology 130 to divide the 3D surface into a plurality of smaller and more readily fabricated chips or sections. A file is generated for each of these chips/subsections as shown at 126 in memory 120, and the files 126 include a location 127 for each chip as well as a boundary 128 defining the chips size, shape, and orientation relative to the other chips on the offset topology 130.

The design software package 140 further includes a rebar line (or piece)-defining module 146 that defines the number and location of each piece of rebar in each chip as shown at 132 in memory 130. The rebar definitions 132 also include definitions of each bend along the length of each piece of rebar in each chip 126. The design software package 140 additionally includes a rebar redundancy module 146 that processes each of the rebar definitions 132 for each chip 126 to determine whether the originally number of rebar pieces can be reduced by identifying any rebar pieces that are structurally redundant (thus, allowing their removal from the rebar definitions 132). The design software package 140 includes a drawing generator 148 that acts to create a general assembly drawing 134 of the support frame/cage for the target rockwork structure that shows the locations of each chip/subsection and how these should be assembled. The drawing generator 148 also is configured to generate an assembly drawing 136 for each of the chips 126 showing how each chip should be assembled including the location and orientation of each piece of bent rod/rebar and where these should be interconnected (e.g., weld locations) to fabricate the chip.

The output of the design system 110 includes a file 150 that defines the rebar pieces for all the chips including their lengths and the discrete bends to be formed in each piece. This file 150 is provided as input to or is read by a rebar bender (or rod bending machine), and the rebar bender automatically forms each piece of rebar needed for the chips of the support frame/cage of the target rock structure by forming the defined bends at the proper locations along the lengths of the input rebar pieces/metal rods (e.g., stainless steel (SS) or other metal rods with an outer diameter in the range of 0.125 to 0.5 inches or the like) and with the proper orientations. The bent rebar/metal rods 170 output from the bending machine are labeled/tagged based on the chip assembly drawings 136 to facilitate later assembly together to form each chip/subsection of the support frame/cage of the fabricated rockwork structure.

Figure 2:
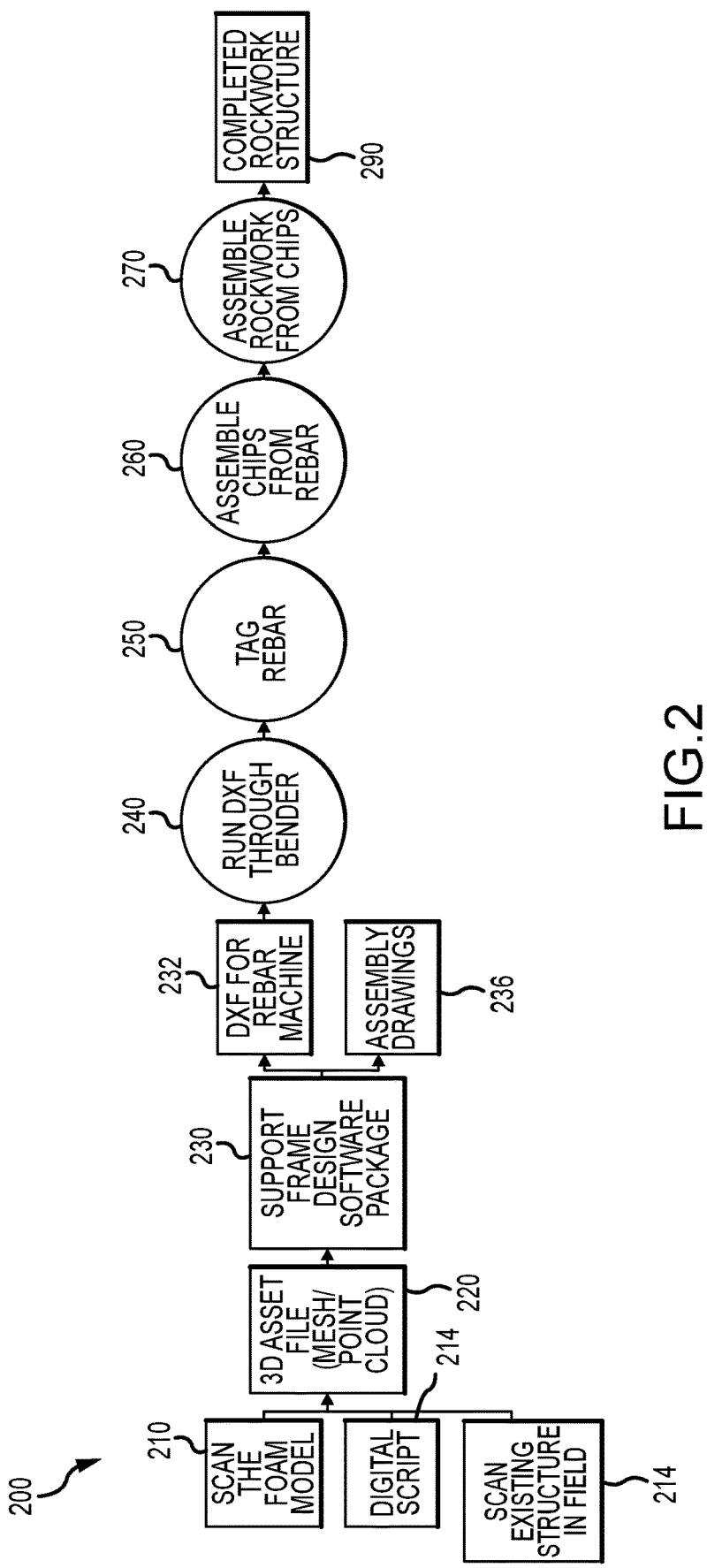
FIG. 2 is a work flow diagram or pipeline illustration for a design and fabrication process for a rockwork structure as may be performed using the system of FIG. 1.

FIG. 2 is a work flow diagram or pipeline illustration for a design and fabrication process 200 for a rockwork structure as may be performed by operating the system 100 of FIG. 1. As shown, the pipeline/process 200 includes generating a 3D asset file 220, which may be a mesh or point cloud, defining the exterior surfaces of a target rockwork structure, and this may be created from either a file generated through a 3D scan of a foam model 210 or a scan in the field of an existing structure (e.g., when one or portions of one are being replaced/reconstructed as part of a refurbishment effort) 212 or a digital model or sculpt 214 of the target rockwork structure (which may be an existing rockwork structure being refurbished or a new build).

The 3D asset file 220 is provided as input to the support frame design software package 230 (which may take the form of software 140 run in system 110 of FIG. 1 in some cases). The components (software modules and/or algorithms performed by software routines) of the software package 230 are discussed in detail below. In brief, though, the software package 230 processes the 3D asset file 220 and generates a file 232 defining each rebar piece/metal rod with its length and bends for a rebar bending machine. The file 232 may be a standard computer-aided design (CAD) file (such as a DXF file output by AutoCAD or the like) or other format acceptable to the machine chosen for automating the bending of the rebar pieces/metal rods. The software package 230 also generates and outputs assembly drawings 236 used by construction workers in first assembling each chip/subsection and second assembling the chips/subsections together to form a support frame/cage.

In the pipeline 200 at 240, the rebar-defining file 232 is run through a rebar bender to fabricate all the individual pieces of rebar or metal rods with discrete bends. At 250 in the pipeline 200, each output piece of rebar is tagged with IDs based on the assembly drawings 236. Then at 260 workers use the assembly drawings 236 to assembly the chips of the support frame from the rebar from steps 240 and 250. At 270, the rockwork's support frame/cage is assembled using the chips from step 260 and the assembly drawings 236. Finally, at step 290 of the pipeline 200, the rockwork structure is completed such as by applying plaster to the support frame to provide an outer layer/shell and, optionally, further texturing or coating (e.g., painting) its outer surfaces to achieve a desired appearance.

Figure 3:
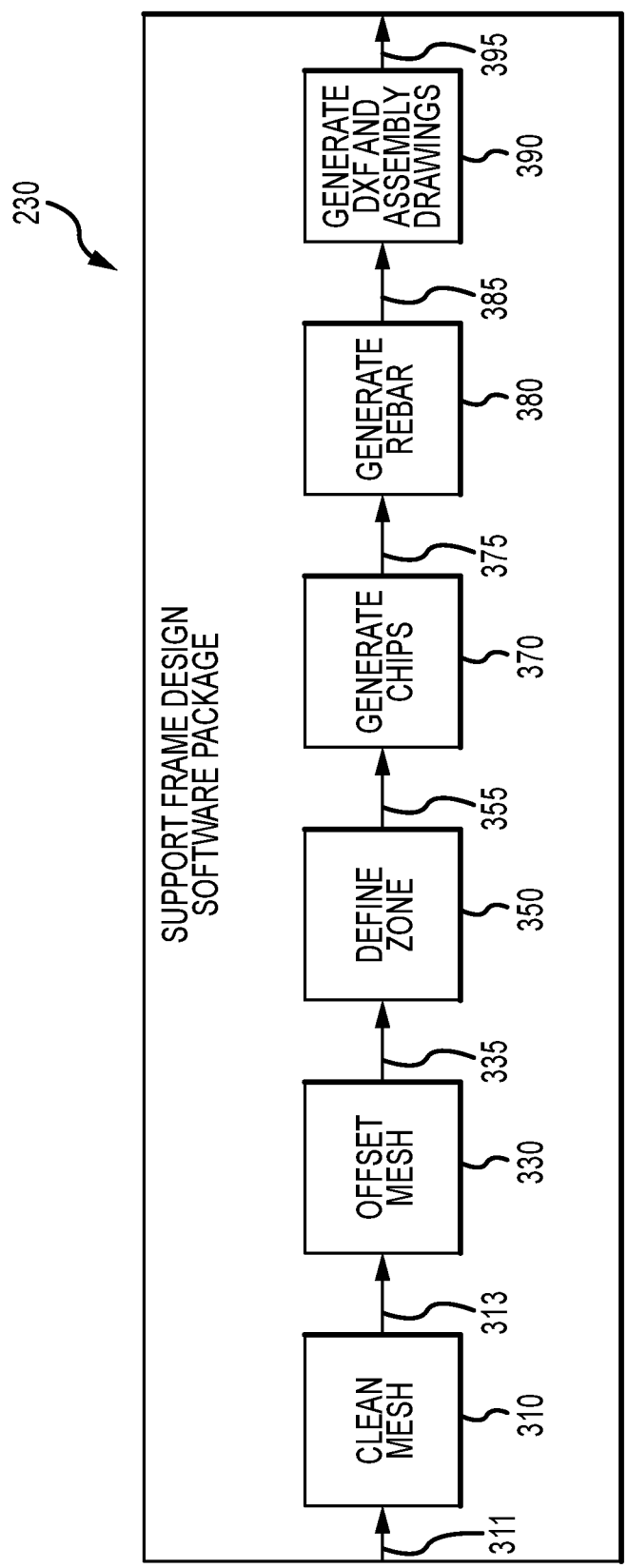
FIG. 3 is a detailed view of the rebar design software package or suite of FIG. 2 showing functions or methods performed by each of its algorithms (or software routines or modules implementing one or more of those algorithms)

FIG. 3 is a detailed view of the rebar design software package or suite 230 of FIG. 2 showing the functions or methods performed by each of its algorithms (or software routines or modules implementing one or more of those algorithms as shown for design software package 140 in FIG. 1). Each of these functions or methods is described in more detail below. Briefly, though, the software package/suite 230 takes as input 311 the 3D asset file 220 shown in FIG. 2. This is processed by a first module/software routine at 310 to generate a clean mesh that is output at 313. A second module/software routine at 330 processes the clean mesh to provide an offset mesh that is output at 335. A third module/software routine takes this as input and at 350 defines a set of zones of the offset (and clean) mesh for further processing.

A fourth module or subroutine takes as input 355 the defined zones along with the offset mesh to, at 370, generate a plurality of chips or subsections of the offset mesh. The chip definitions are output at 375 to a fifth module or subroutine that at 380 processes the chip definitions to generate for each chip a set of rebar pieces/metal rods to be used in the fabrication of that chip, including discrete bend locations and definitions for each rebar piece/metal rod. This data file is then output at 385 for use by a sixth module or subroutine in generating, at 390, an input file for a bender machine and assembly drawings for the support frame (how to assembly the chips) and for each chip (which rebar pieces to include and how to assembly these rebar pieces together to form the chip). These are output at 395 for use to operate a rebar bender and by workers in assembling the chips and the support frame using the output of the rebar bender.

Step/function 310 shown in FIG. 3 may involve first performing a point cloud-to-mesh conversion depending on the format of the input file at 311. A point cloud (such as from a 3D scan of a model of a rockwork structure or an existing rockwork structure) is a When conversion is performed, it may be completed using, for example, a commercially available sampling tool or open source system such as the Poisson sampling tool available as part of MeshLab or the like. Uniform mesh resampling may also be performed in step 310 followed by cleaning and/or repairing the resulting mesh such as with the automated "repair mesh" tool, e.g., Rhinoceros (often called "Rhino") available from Robert McNeel and Associates or other software tool developers such as Design X and its "global re-mesh" tool/routine.

Step/function 330 takes as input the mesh generated in step/function 310 and modifies the mesh to place it at an offset distance from the surface level of the rockwork structure so that it is at the level at which the rebar pieces/metal rods are to be constructed to form the support frame/cage. As noted earlier, the offset distance can be set by the user as one of the user-defined parameters/variables and is often chosen to be in the range of 1 to 6 inches (or at a desired/planned thickness of the outer layer/shell of plaster or other materials). There are several algorithms that may be used by this routine or module to generate the offset mesh. One example is the Rhino Offset, which provides a quick and relatively easy solution and provides a configurable offset distance. In some cases, though, it may cause self-intersection, and, additionally, it may be useful for the offsetting process to provide additional cleanup of the mesh from step 310.

With this in mind, one preferred embodiment of the design software suite uses a modified version of the Marching Cubes algorithm. It is "modified" at least because it is configured to clean the mesh automatically by filling small holes where laser scanning failed to do so. This is useful as the Marching Cubes algorithm works best when it is provided an extremely clean mesh. The offset is achieved with a distance offset rather than a volumetric offset, and the mesh will never self-intersect. The offset distance and other details are user configurable with the Marching Cubes algorithm.

With the modified Marching Cubes algorithm with hole fills, a signed distance field may be used. The signed distance field measures the distance from each point in a 3D matrix space and assigns a distance to it. This distance is determined by finding the closest point on a mesh from each point in the field. Significantly, the modified algorithm determines if that "closest point" lies on a "naked edge" of the mesh. If the naked edge of the mesh has less than a certain number of segments or is less than a certain distance, then the algorithm allows that signed distance value to be counted in the signed distance field. If it does not meet those requirements, then it is disregarded and the algorithm exposes a hole or the edge of the mesh, when applicable. In prototypes of the algorithm, holes in a mesh were successfully filled, and the algorithm exposed edges around "non-watertight" meshes.

Figure 4:
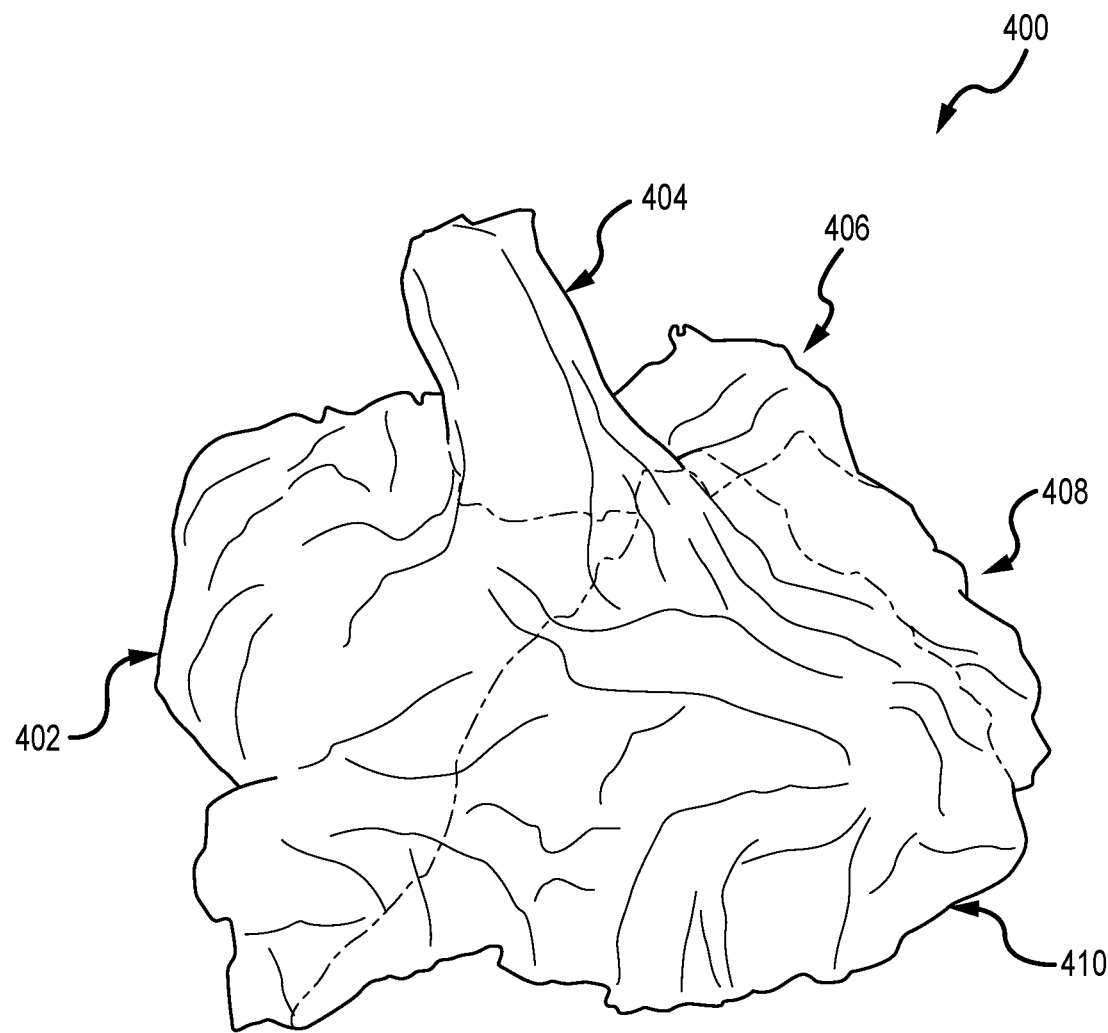
FIG. 4 shows the step of defining zones (or portions, subparts, or the like) of a 3D model of a rockwork structure for use in making the chip generation more efficient.

Step/function 350 of FIG. 3 involves defining zones of the input 3D model/asset or of the offset mesh to facilitate later processing steps including generating chips/subsections. FIG. 4 illustrates a 3D model of a rockwork structure 400 (or, in some cases, the offset and clean mesh output from step 330) that has been processed to define a set of zones 402, 404, 406, 408, and 410 that divide the overall structure 400 to partial meshes. The zones 402, 404, 406, 408, and 410 are easier to manage in processing than the entire structure 400 when performing chipping (or chip definition) in step/function 370. Zones may be defined manually in some embodiments by a user such as to fulfill a creative intent (similar texture, coloring, or concurrent viewing by observers) and/or to suit construction purposes. In other embodiments, the zones 402-410 are defined automatically by a zone-defining algorithm.

Figure 5:
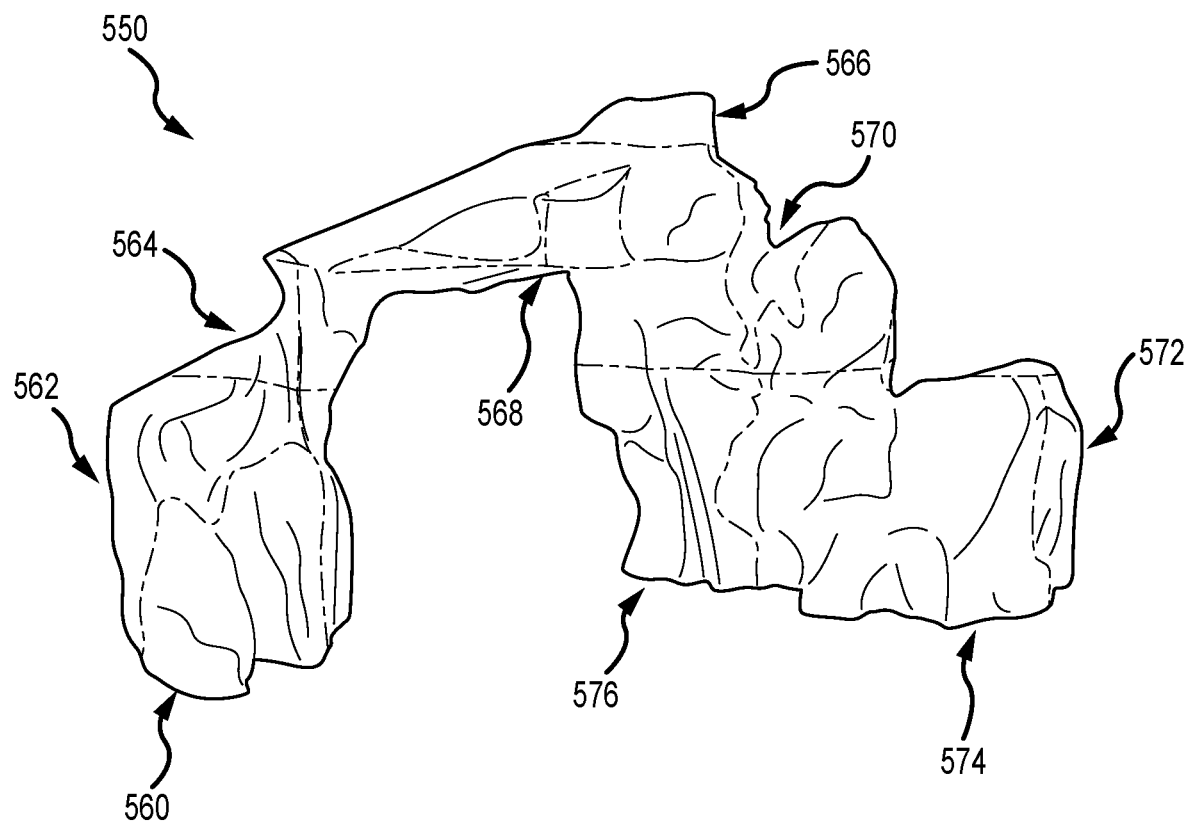
FIG. 5 shows graphically the step of generating a set of chips from a mesh or 3D model zone.

Step/function 370 of FIG. 3 involves generating or defining chips or subsections for each of the zones created in step 350. FIG. 5 illustrates a zone 550 of an offset mesh (exterior surface of a 3D model/asset) that has been (or is being) divided up into a plurality of chips/subsections 560-576, and each of these define a portion of the 3D surface of the zone for which a set or assembly of rebar pieces/metal rods will be used in the fabrication of that chip/subsection. In some embodiments, the chip-defining module (or its underlying algorithms) is designed so that the level height is configurable or user-definable. Further, it often will be useful for the user to be able to define the chip dimensions or size (e.g., to define the chips length and width, with a default value sometimes starting at 6 foot by 6 foot maximum values as sizes larger than this can be difficult for workers to handle during fabrication of the rebar support frame or cage upon assembly of all the chips/subsections).

The chip-defining module may include a subroutine that allows a user to automatically merge two or more chips into a single chip or to split chips into two or more chips (e.g., to include a merge chip function and a split chip function). In general, the less chips included in each zone the better for improving efficiency and accuracy of manufacture of a support frame. In other cases, a user of the software tool can also manually merge and split chips to get desired look and feel by keeping portions of the 3D surface together or to split up portions of the 3D surface (such as by types of texturing, color of painting, portions viewed together by observers, and so on).

In some cases, a user will set a minimum surface area for each chip, and the software will automatically merge chips that are too small based on this set minimum. In other cases, adjacent chips are automatically identified that together do not exceed the maximum lengths and widths and then the user/operator has the option to merge adjacent chips (e.g., the software includes "auto-merge" settings). The software/module may also include automated chip ordering routines and naming, e.g., to linearly work through the chips from a starting point (e.g., Chip1, Chip2, and so on) to facilitate later tagging and assembly (per an assembly drawing output by the design software package). In some embodiments, the software package is also adapted to allow the user to change the chip level up or down.

Step/function 380 shown in FIG. 3 involves the rebar line-defining module processing each chip defined in step/function 370 to generate a set of rebar pieces/rod segments for each chip. The module may allow the user to choose a default distance between the adjacent pairs of rebar pieces (e.g., in the range of 2 to 8 inches or the like). The module also typically will take as parameters/variables in its algorithms the rebar bender's constraints including minimum distance between bends along a length of rebar and a maximum bend angle for the bender.

Figure 6:
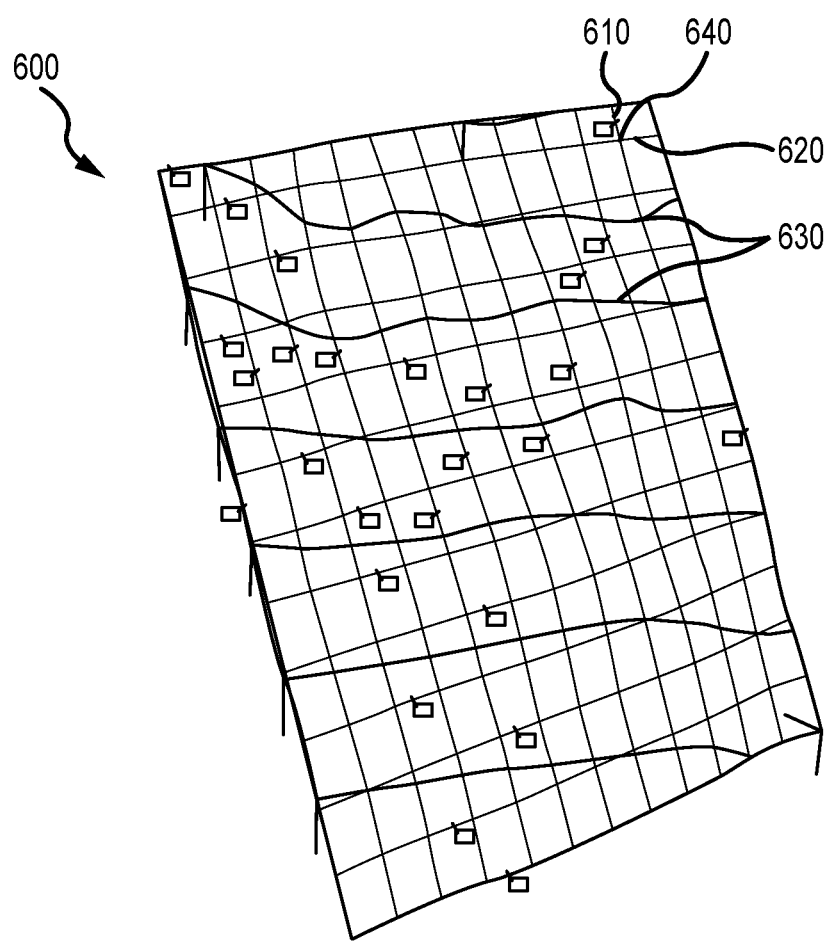
FIG. 6 is a perspective view of a set of rebar pieces and their assembly to form a support frame or cage for a single chip.

FIG. 6 illustrates a rebar support frame 600 for an exemplary chip from step 370. As can be seen, the frame 600 includes a plurality of vertical pieces 610, a plurality of horizontal pieces 620, and a plurality of Z bars, and the frame 600 defines intersection points 640 between overlapping pairs of the components 610, 620, and 630 that define connection locations for these components (e.g., weld points or other coupling processes) where the frame gets much of its strength. The rebar line-defining module may be adapted to provide the user with a configurable ratio (another input parameter/variable of the software) to determine if Z bars/pieces are needed, and this ratio can be defined by the distance between intersection points.

In some embodiments, a rebar redundancy module (such as module 147) is run that may be thought of as (or include) a "Smart Z" algorithm that determines where Z bars are beneficial and where they will just get in the way. This determination is made based on distance calculations with other intersecting bars (e.g., horizontal and vertical pieces of rebar in the support frame/cage for the chip). The Smart Z algorithm helps keep the structure as light and as rigid as possible with as few Z bars as practical while still maintaining structural integrity or a desired strength. The rebar line-defining module can be adapted to create a visual of the jig to facilitate fabrication. Further, the module may include a rebar optimization routine that removes any rebar pieces identified as redundant, which reduces the time to fabricate rebar pieces, reduces material costs, and reduces assembly time.

The rebar line-defining module may utilize a variety of algorithms (alone or in combination) to define the rebar pieces or rods for the chip support frames/cages. Each can be chosen or modified to provide the discrete bends on each rebar piece. For example, an input mesh for a chip or subsection can be processed with one or more rebar bending algorithms including, but not limited to: a raw point algorithm, a common point algorithm, a Ramer-Douglas-Peucker (RDP) algorithm, or a combination of two or more these (e.g., an rebar line-defining algorithm that uses a custom algorithm that performs a common point method followed by an RDP method on the input mesh for a chip).

Figure 7A:
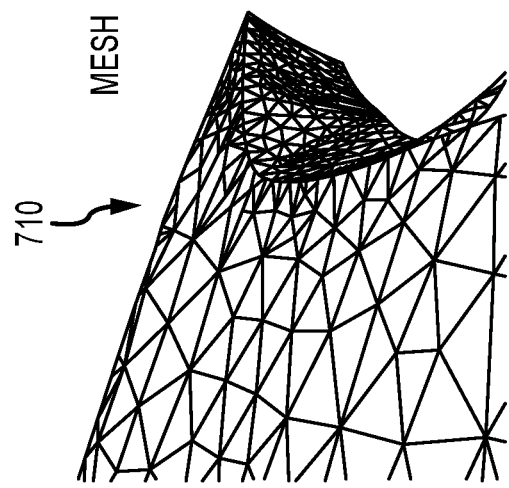
FIGS. 7A-7E illustrate, respectively, a chip mesh and rebar line definitions produced by four different algorithms of the present description.
Figure 7B:
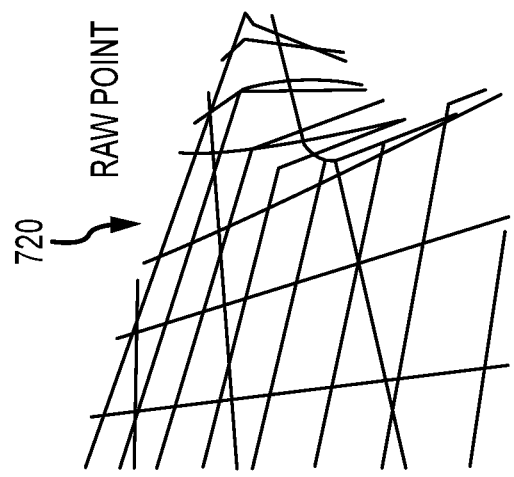

FIG. 7A illustrates a mesh 710 that may be defined for a particular chip or subsection of a support frame. FIG. 7B illustrates the results of processing this mesh 710 with a raw point algorithm to generate a set of rebar pieces 720. This algorithm provides an extremely accurate assembly or set of rebar pieces 720 with simple computation, and it also provides a very accurate guide for all other methods. However, in many applications, the raw point method may provide too many bends in the rebar pieces, which can complicate fabrication by the bender and potentially harm accuracy of the support structure in providing the mesh.

Figure 7C:
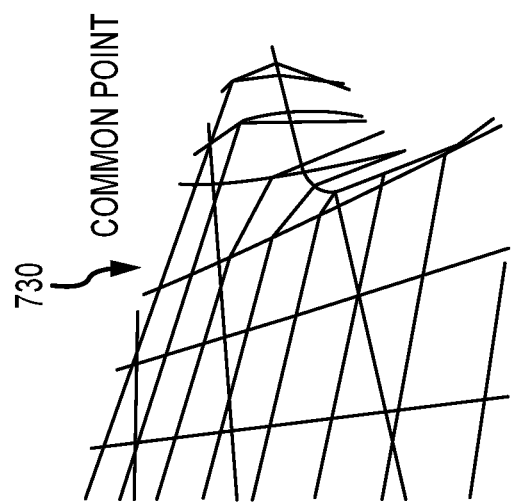

FIG. 7C illustrates the results of processing this mesh 710 with a common point algorithm to generate a set of rebar pieces 730. This algorithm provides an assembly or set of rebar pieces 730 in which all intersections match (in contrast to RDP point algorithms), and the common point algorithm decreases the number of bends needed to form the support frame/cage for the chip when compared to the raw point algorithm. However, the common point algorithm may provide loss of detail between common points and may not be configurable by a user.

Figure 7D:
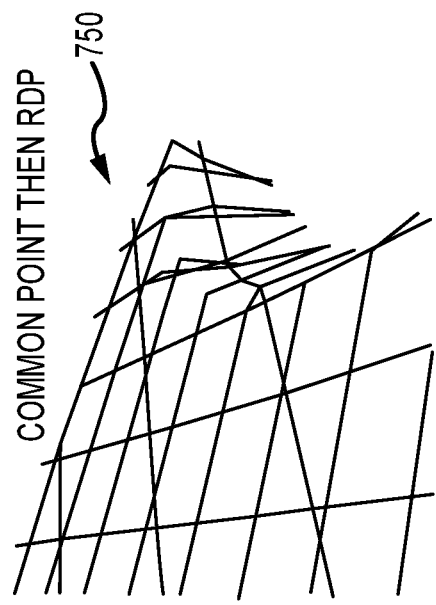

FIG. 7D illustrates the results of processing the mesh 710 with an RDP point algorithm to generate a set of rebar pieces 740 to form a chip support structure/cage. The RDP point algorithm extremely decreases the number bends needed in the frame/cage when compared to the raw point method, and it is configurable by a user to suit a particular application. However, it may result in loss of accuracy, and the intersection points (or common points) between polylines may be slightly off between two pieces of rebar.

Figure 7E:
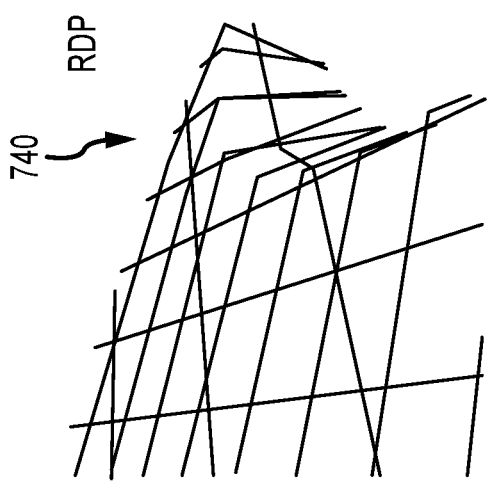

The inventors recognized that it may be desirable to provide a better result than achieved with any one of these three algorithms when used alone, and the inventors determined it may be useful to create a new rebar line-defining algorithm that combines two of these algorithms. Particularly, FIG. 7E illustrates the results of processing the mesh 710 with the new algorithm that is a combination of common point with RDP to generate a set of rebar pieces 850 useful to form a chip support structure/cage. The new algorithm involves a common point processing followed by RPD processing on small segments of the results to add detail between intersections. The new algorithm insures all intersections match while decreasing the number of bends when compared with the raw point method. Further, the use of the RDP processing brings back detail that was lost by the common point processing, and the algorithm is also configurable by a user.

Step/function 390 shown in FIG. 3 involves the drawing generator autonomously creating layout and assembly drawings of each chip's support frame/cage indicating the pieces of rebar to include along with their IDs, orientations within the support frame/cage of the chip, and connection/intersection points with other pieces (as well as with edge connections with adjacent chips' frames/cages). The user, in some cases, may have the opportunity to select among a number of views such as an upper left isometric view, a top view, an upper right isometric view, a lower left isometric view, a front view, and a lower right isometric view. The drawing generator may export the assembly drawings in a standard format such as DXF into a folder structure for later use. The drawing generator creates a global assembly file for each zone.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

For example, the above description noted that a user may be able to configure or set a number of parameter or variable values to configure the support frame design software package and its results. For example, the user may be allowed to set the offset distance, which is the amount of distance the offset mesh will be offset from the surface mesh. The user can sometimes set the offset additive edge cutting factor, which is the amount of distance that will be cut from the edges when offsetting a mesh. If this value is set too high all edges of the offset mesh will regress significantly. However, a typical rule of thumb is to make this distance at least half the size of the offset distance to ensure the offset mesh is not continuous on both sides. Another user selectable parameter is the offset resolution, which is the resolution distance for each voxel when using the Marching Cubes algorithm. The smaller this value is the higher the resolution and the longer the computation time. The larger this value is the lower the resolution.

Other configurable parameters include: chip height (which sets the desired chip height); chip length (which sets the desired chip length and this value may also be used for the chip width); minimum chip surface area (which sets the minimum surface area for a chip before trying to perform an auto-merge); maximum additive chip length (which sets the maximum additive length distance to a chip when auto-merged with another chip); maximum additive chip height (which sets the maximum additive height distance to a chip when auto-merged with another chip); and tie off location to mesh tolerance (which is the tolerance of which a tie off location can be part of a chip, and if a tie off location is less than this distance away from a chip that chip will claim it as one of its tie off locations).

In generating the rebar line definitions for a chip support frame/cage, the following parameters may be set by a user: length between rebar (which is the length between rebar of the same axis on a chip (e.g., the horizontal bars will have a 6-inch space or the like); use Smart Z detection (which will either run the smart node detection for Z bars (if needed) or not; Smart Z bar distance (which is the value for the longest distance a Z node can be from another node when determining if a Z bar is necessary (e.g., half the length between rebar pieces); minimum rebar length (which is the minimum length any rebar can be, and rebar that are generated shorter than this length will be deleted from the frame/cage for the chip); Z bar ratio (which is the ratio of length to length that determines if a Z bar is needed for the chip); maximum length between bends (which is the maximum allowable length between any two bends on a piece of rebar such as 2 inches for some benders); maximum bend angle (which is the maximum angle a bend can be on a piece of rebar (e.g., 120 degrees for some benders); RDP tolerance (which is the epsilon tolerance used in the RDP algorithm, with a smaller length providing a higher resolution); create raw polyline setting (which will cause the software to create the raw polylines instead of the RDP polylines; rebar tab length (which is the length for the "tab" that will be added to the end of each rebar piece for assembly); and maximum iteration for rebar constraint checker (which is the maximum number of times the constraint checker will try to edit the polyline to meet all constraints).

We claim:

1. A system for automating design of a support frame for artificial rockwork structures, comprising:
   a processor;
   memory storing a three dimensional (3D) mesh for an exterior surface of a rockwork structure;
   an offset module comprising software executed by the processor to process the 3D mesh and generate an offset mesh defining a 3D topology of the exterior surface at an offset distance from the 3D mesh;
   a chip-defining module comprising software executed by the processor to divide the offset mesh into a plurality of subsections; and
   a rebar line-defining module comprising software executed by the processor to generate an assembly of rebar pieces for each of the subsections that defines for each of the rebar pieces a length, a location within the subsection, and a set of spaced apart bends.

2. The system of claim 1, wherein the software of the offset module includes a Marching Cubes algorithm configured to identify and fill holes in the 3D mesh while generating the offset mesh.

3. The system of claim 2, wherein the offset distance is defined based on a user input distance value.

4. The system of claim 1, wherein each of the subsections has a surface area limited by a maximum length and a maximum width that are adjustable based on user input.

5. The system of claim 1, wherein the chip-defining module includes an automated merge function merging adjacent pairs of the subsections into a new subsection when one of the subsections is determined to have a surface area less than a predefined minimum surface area and when the new subsection has outer dimensions smaller than predefined maximum outer dimensions.

6. The system of claim 1, wherein the rebar line-defining module processes each of the subsections of the offset mesh using at least one of a raw point algorithm, a common point algorithm, and a Ramer-Douglas-Peucker (RDP) algorithm to generate the assembly of the rebar pieces.

7. The system of claim 1, wherein the rebar line-defining module processes each of the subsections of the offset mesh first using a common point algorithm and second using a Ramer-Douglas-Peucker (RDP) algorithm on a subset of segments to insert additional detail.

8. The system of claim 7, wherein the rebar line-defining module defines for each of the bends a bending angle and spaces adjacent ones of the bends apart by at least a predefined bend spacing.

9. The system of claim 1, further comprising a drawing generator run by the processor to generate assembly drawings mapping locations of the rebar pieces within each of the subsections and defining assembly of the subsections together to form a support frame for the rockwork structure.

10. The system of claim 1, further comprising a module run by the processor that generates the 3D mesh from a point cloud file for the exterior surface.

11. The system of claim 1, wherein the rebar line-defining module includes an algorithm processing the assembly of the rebar pieces to identify and delete redundant Z bars based on intersection distances.

12. A system for automating design of a support frame for artificial rockwork structures, comprising:
a processor;
memory storing a digital three dimensional (3D) model defining an exterior surface of a rockwork structure; and
a set of program instructions executable by the processor to:
generate an offset 3D mesh from the 3D model defining a 3D topology of the exterior surface at an offset distance;
divide the offset mesh into chips; and
generate a plurality of rods for each of the chips arranged to provide a portion of a support frame for an exterior material layer for fabricating the rockwork structure, wherein each of the rods is defined by a length, a location within one of the chips, and a set of spaced apart bends defined by a bend angle.

13. The system of claim 12, wherein the generating of the offset mesh is performed using a Marching Cubes algorithm configured to identify and fill holes in the 3D mesh while generating the offset mesh.

14. The system of claim 12, wherein, during the dividing of the offset mesh in the chips, each of the chips has a maximum length and a maximum width that are default values or are adjustable based on user input.

15. The system of claim 12, wherein the set of program instructions provides an automated merge function merging adjacent pairs of the chips into a new chip when one of the chips is determined to have a surface area less than a predefined minimum surface area and when the new chip has outer dimensions smaller than predefined maximum outer dimensions.

16. The system of claim 12, wherein each of the chips of the offset mesh is created using at least one of a raw point algorithm, a common point algorithm, and a Ramer-Douglas-Peucker (RDP) algorithm to generate the assembly of the rebar pieces.

17. The system of claim 16, wherein each of the chips is processed first using a common point algorithm and second using an RDP algorithm on a subset of segments to insert additional detail.

18. The system of claim 12, wherein the set of program instructions includes an algorithm processing the plurality of rods for each of the chips to identify and then delete redundant Z bars.

19. A system for automating design of a support frame for artificial rockwork structures, comprising:
a processor;
memory storing a three dimensional (3D) mesh for an exterior surface of a rockwork structure;
an offset module comprising software executed by the processor to process the 3D mesh and generate an offset mesh defining a 3D topology of the exterior surface at an offset distance from the 3D mesh;
a chip-defining module comprising software executed by the processor to divide the offset mesh into a plurality of subsections; and
a rebar line-defining module comprising software executed by the processor to generate an assembly of rebar pieces for each of the subsections that defines for each of the rebar pieces a length, a location within the subsection, and a set of spaced apart bends,
wherein the rebar line-defining module processes each of the subsections of the offset mesh first using a common point algorithm and second using an RDP algorithm on a subset of segments.

20. The system of claim 19, wherein the software of the offset module includes a Marching Cubes algorithm configured to identify and fill holes in the 3D mesh while generating the offset mesh, wherein the rebar line-defining module defines for each of the bends a bending angle and spaces adjacent ones of the bends apart by at least a predefined bend spacing of at least two inches, and wherein the rebar line-defining module includes an algorithm processing the assembly of the rebar pieces to identify and delete redundant Z bars based on intersection distances.

* * * * *